US011514965B2

(12) United States Patent
  Antonyan

(10) Patent No.: US 11,514,965 B2
(45) Date of Patent: Nov. 29, 2022

(54) RESISTIVE MEMORY DEVICE

(71) Applicant: SAMSUNG ELECTRONICS CO., LTD., Suwon-si (KR)

(72) Inventor: Artur Antonyan, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/330,060

(22) Filed: May 25, 2021

(65) Prior Publication Data

US 2022/0157363 A1     May 19, 2022

(30) Foreign Application Priority Data

Nov. 13, 2020   (KR) .................. 10-2020-0151418

(51) Int. Cl.
  *G11C 11/16*     (2006.01)
(52) U.S. Cl.
  CPC ........ *G11C 11/1697* (2013.01); *G11C 11/161* (2013.01); *G11C 11/1659* (2013.01); *G11C 11/1675* (2013.01); *G11C 11/1657* (2013.01)
(58) Field of Classification Search
  None
  See application file for complete search history.

(56) References Cited

U.S. PATENT DOCUMENTS

| | | | |
|---|---|---|---|
| 7,760,543 | B2 | 7/2010 | Ueda |
| 9,082,496 | B2 | 7/2015 | Lee et al. |
| 9,183,912 | B2 | 11/2015 | Gogl et al. |
| 10,068,628 | B2 | 9/2018 | Wei et al. |
| 10,360,948 | B2 | 7/2019 | Antonyan |
| 2013/0028010 | A1 | 1/2013 | Li et al. |
| 2016/0148687 | A1* | 5/2016 | Chou ................. G11C 13/0038 365/148 |
| 2017/0345496 | A1* | 11/2017 | Liu ..................... G11C 13/0026 |
| 2019/0287574 | A1 | 9/2019 | Antonyan |

* cited by examiner

*Primary Examiner* — James G Norman
(74) *Attorney, Agent, or Firm* — Myers Bigel, P.A.

(57) ABSTRACT

A resistive memory device is provided. The resistive memory device includes a bitline, a source line, a memory cell electrically connected to the bitline and the source line by a first switch, a first transistor electrically connected to the bitline, a second transistor electrically connected to the source line, a gate voltage generator configured to generate a first gate voltage that is provided to a gate electrode of the first transistor, and configured to generate a second gate voltage that is provided to a gate electrode of the second transistor and a second switch that provides the first and second gate voltages to the gate electrodes of the first and second transistors.

18 Claims, 14 Drawing Sheets

174

RESISTIVE MEMORY DEVICE

CROSS-REFERENCE TO RELATED APPLICATION

This application claims priority to Korean Patent Application No. 10-2020-0151418, filed on Nov. 13, 2020, and all the benefits accruing therefrom under 35 U.S.C. § 119, the disclosure of which is incorporated herein by reference in its entirety.

BACKGROUND

The present disclosure relates to a resistive memory device.

Examples of a nonvolatile memory device using a resistance material include a phase-change random-access memory (PRAM), a resistive random-access memory (RRAM), and a magnetic random-access memory (MRAM). A dynamic random-access memory (DRAM) device or a flash memory device stores data using electric charges, whereas a non-volatile memory device using a resistance material stores data using changes in the state of a phase-change material such as a chalcogenide alloy (in the case of a PRAM), a change in the resistance of a variable resistor (in the case of an RRAM), or a change in the resistance of a magnetic tunnel junction (MTJ) thin film depending on the magnetization state of a ferromagnetic material (in the case of an MRAM).

MRAMs, in particular, have attracted attention due to their high read and write speeds, durability, nonvolatility, and low power consumption. MRAMs can store information using a magnetic material as an information storage medium.

SUMMARY

Embodiments of the present disclosure provide a resistive memory device with reduced power consumption.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a resistive memory device that includes a bitline, a source line, a memory cell electrically connected to the bitline and the source line by a first switch, a first transistor electrically connected to the bitline, a second transistor electrically connected to the source line, a gate voltage generator configured to generate a first gate voltage that is provided to a gate electrode of the first transistor, and configured to generate a second gate voltage that is provided to a gate electrode of the second transistor, and a second switch configured to provide the first and second gate voltages to the gate electrodes of the first and second transistors.

According to the aforementioned and other embodiments of the present disclosure, a resistive memory device includes a bitline, a source line, a memory cell electrically connected to the bitline and the source line by a first switch, a first transistor electrically connected to the bitline, a second transistor electrically connected to the source line, a second switch electrically connected to gate terminals of the first and second transistors, and a gate voltage generator including a variable resistor and configured to generate first and second gate voltages based on a resistance of the variable resistor. The second gate voltage is lower than the first gate voltage. The second switch is configured to provide the first gate voltage to the gate terminal of the second transistor in response to a first write control signal and configured to provide the second gate voltage to the gate terminal of the first transistor in response to a second write control signal, which is different from the first write control signal.

A resistive memory device includes a write driver and a gate voltage generator that is configured to generate a gate voltage. The write driver includes a bitline, a source line, a first switch, that is electrically connected to the bitline and the source line, a first transistor, that is electrically connected to the bitline, and a second transistor, that is connected to the source line. The gate voltage generator includes a first gate transistor, which shares a gate terminal of the first transistor, and a variable resistor that is electrically connected to a gate terminal of the second transistor and a first terminal of the first gate transistor.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
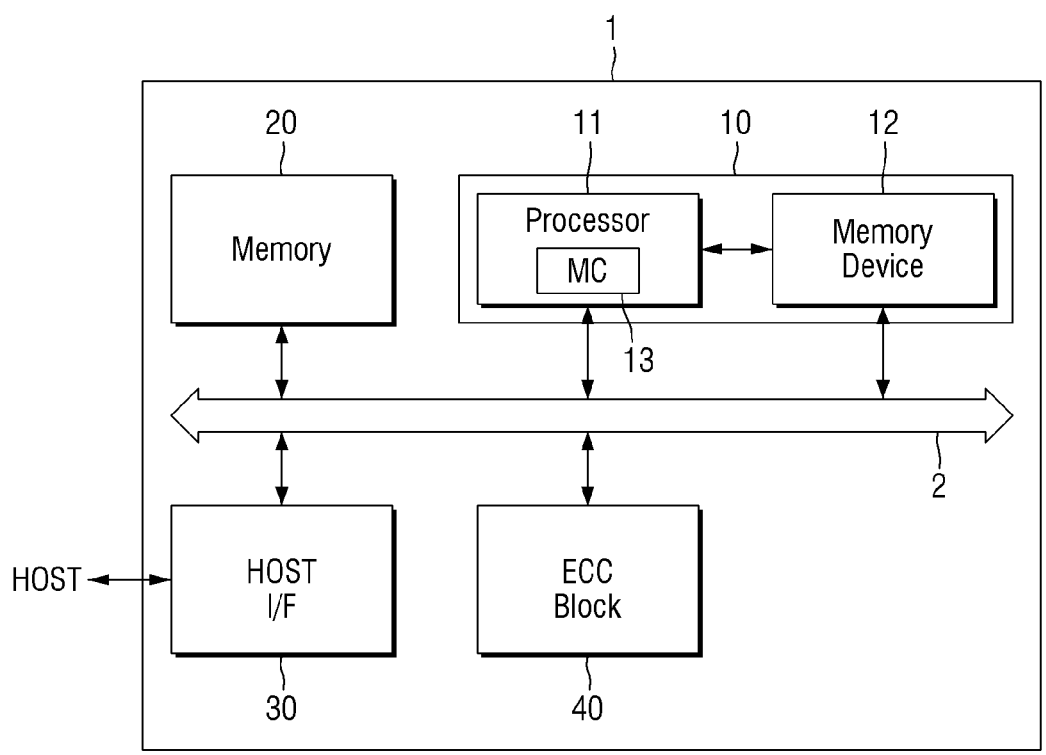
FIG. 1 is a block diagram of a system including a memory device according to some embodiments of the present disclosure.

FIG. 1 is a block diagram of a system including a memory device according to some embodiments of the present disclosure.

Referring to FIG. 1, a system 1 includes a memory device 12 and a processor 11, which controls the general operation of the system 1. The memory device 12 will be described later with reference to FIGS. 2 through 17.

The memory device 12 and the processor 11 may be packaged into a package 10. The package 10 may be mounted on a system board (not illustrated).

The processor 11 may include a memory controller 13 for controlling an operation of the memory device 12.

The system 1 may include a memory, and the memory 20 may be used as an operation memory for the processor 11. A host that accesses the system 1 may exchange data with the memory device 12 via the processor 11 and a host interface 30. The memory controller 13 may perform the functions of a memory interface. The system 1 may further include an error correction code (ECC) block 40, but the present disclosure is not limited thereto.

The ECC block 40, which operates under the control of the processor 11, may detect and correct one or more errors included in data read from the memory device 12 via the memory controller 13.

The processor 11 may control the exchange of data between the ECC block 40, the host interface 30, and the memory 20 via a bus 2.

The system 1 may be implemented as, for example, a Universal Serial Bus (USB) memory drive or stick.

Figure 2:
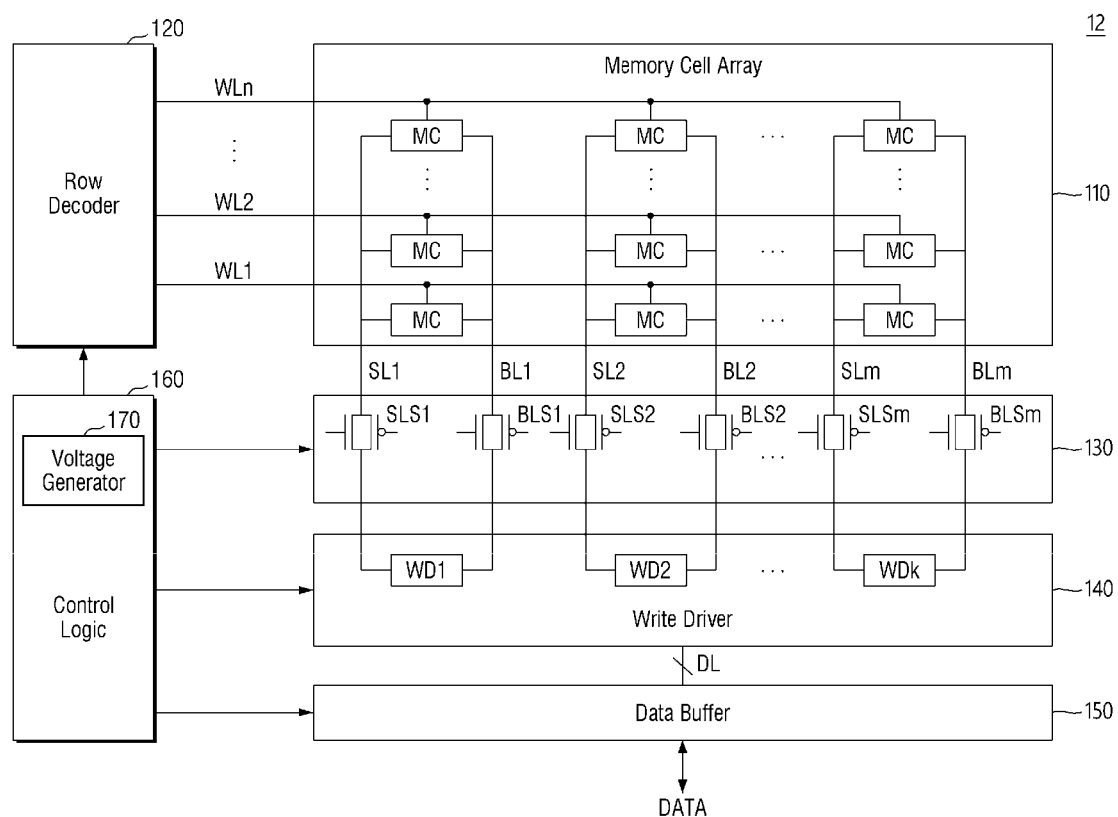
FIG. 2 is a block diagram of a memory device according to some embodiments of the present disclosure.

FIG. 2 is a block diagram of a memory device according to some embodiments of the present disclosure.

Referring to FIG. 2, the memory device 12 includes a memory cell array 110, a row decoder 120, a column decoder 130, a write driver 140, a data buffer 150, and a control logic 160. The control logic 160 may include a voltage generator 170.

The memory device 12 may include a volatile memory such as a dynamic random-access memory (DRAM) or a static random-access memory (SRAM). The memory device 12 may include a nonvolatile memory device such as a flash memory device, a magnetic random-access memory (MRAM) device, a phase-change random-access memory (PRAM) device, a ferroelectric random-access memory (FRAM) device, or a resistive random-access memory (RRAM) device.

The memory device 12 will hereinafter be described as being, for example, an MRAM device, which is a type of resistive memory device, but the present disclosure is not limited thereto. That is, the memory device 12 may be applicable to various volatile memory devices or various other nonvolatile memory devices.

The memory cell array 110 includes memory cells MC. The memory cells MC are connected to first through m-th source lines SL1 through SLm (where m is a positive integer), first through n-th bitlines BL1 through BLm, and first through n-th wordlines WL1 through WLn (where n is a positive integer). The memory cells MC may be arranged in rows and columns. Rows of memory cells MC may be connected to the first through n-th wordlines WL1 through WLn. Columns of memory cells MC may be connected to the first through m-th source lines SL1 through SLm and the bitlines BL1 through BLm. As used herein the term "connection" may include physical and/or electrical connection between elements.

The row decoder 120 may control the voltages of the first through n-th wordlines WL1 through WLn under the control of the control logic 160. For example, the row decoder 120 may apply a select voltage for reading or writing data to a selected wordline and/or may apply a non-selection voltage (or non-selection voltages) for preventing the writing or reading of data to the other non-selected wordlines.

The column decoder 130 may be connected to the first through m-th source lines SL1 through SLm and the first through m-th bitlines BL1 through BLm in the memory cell array 110. The column decoder 130 may be connected to the write driver 140. The column decoder 130 may electrically connect some of the first through m-th source lines SL1 through SLm that are selected and some of the first through m-th bitlines BL1 through BLm that are selected to the write driver 140 under the control of the control logic 160.

The column decoder 130 may include first through m-th source line selection transistors SLS1 through SLSm, which are connected to the first through m-th source lines SL1 through SLm, respectively, and first through m-th bitline selection transistors BLS1 through BLSm, which are connected to the first through m-th bitlines BL1 through BLm, respectively.

The column decoder 130 may apply bias voltages to non-selected source lines and non-selected bitlines under the control of the control logic 160. The bias voltages may be determined not to influence a write or read operation to be performed on selected memory cells MC that are connected to the selected wordline, the selected bitlines, and the selected source lines and may include, for example, a ground voltage.

The write driver 140 may include first through k-th write drivers WD1 through WDk (where k is a positive integer). During a write operation, the first through k-th write drivers WD1 through WDk may be connected to the selected bitlines and the selected source lines via the column decoder 130. For example, each of the first through k-th write drivers WD1 through WDk may be connected to one selected bitline and one selected source line.

The first through k-th write drivers WD1 through WDk may write data to the selected memory cells MC. For example, when the state of a particular memory cell (e.g., a low- or high-resistance state) and the state of data to be written to the particular memory cell (e.g., a low- or high-resistance state) differ, the write driver 140 may change the state of the particular memory cell.

For example, the write driver 140 may transmit a write voltage to one of a source line and a bitline that are connected to the particular memory cell and may transmit a low voltage (e.g., the ground voltage) to the other line to change the state of the particular memory cell.

When the state of the particular memory cell and the state of data to be written to the particular memory cell are the same, the write driver 140 may not change, but maintain the state of the particular memory cell.

When the state of the particular memory cell is not changed, but maintained, the write driver 140 may transmit a write-protection voltage (e.g., the ground voltage) to the respective source line and the respective bitline that are connected to the particular memory cell.

During a write operation, the first through k-th write drivers WD1 through WDk may receive a first gate voltage VG_VBL (of FIG. 5), a second gate voltage VG_VSL (of FIG. 5), a write enable signal, and an inverted write enable signal from the control logic 160. The first through k-th write drivers WD1 through WDk may output the write voltage in response to the first gate voltage VG_VBL, the second gate voltage VG_VSL, the write enable signal, and the inverted write enable signal.

For example, the first through k-th write drivers WD1 through WDk may transmit the write voltage to the selected bitlines or the selected source lines.

For example, during a write operation where the state of the memory cells MC is switched from a first state (e.g., a low- or high-resistance state) to a second state (e.g., a high- or low-resistance state), the first through k-th write drivers WD1 through WDk may transmit the write voltage to the selected bitlines.

For example, during a write operation where the state of the memory cells MC is switched from the second state to the first state, the first through k-th write drivers WD1 through WDk may transmit the write voltage to the selected source lines.

The data buffer 150 may be connected to the write driver 140 via data lines DL. The data buffer 150 may exchange data "DATA" with an external device (e.g., a memory controller) under the control of the control logic 160.

For example, during a write operation, the data buffer 150 may transmit the data "DATA", received from the external device, to the first through k-th write drivers WD1 through WDk.

The control logic 160 may receive a control signal and an address from the external device (e.g., a memory controller). The control logic 160 may control the row decoder 120, the column decoder 130, the write driver 140, and the data buffer 150 in response to the control signal and the address to perform a write or read operation.

The control logic 160 may provide the write enable signal and the inverted write enable signal to the write driver 140. The write enable signal and the inverted write enable signal may be complementary signals, but the present disclosure is not limited thereto. During a write operation, the control logic 160 may control the write enable signal to a high level and the inverted write enable signal to a low level.

The control logic 160 may include a voltage generator 170.

Figure 5:
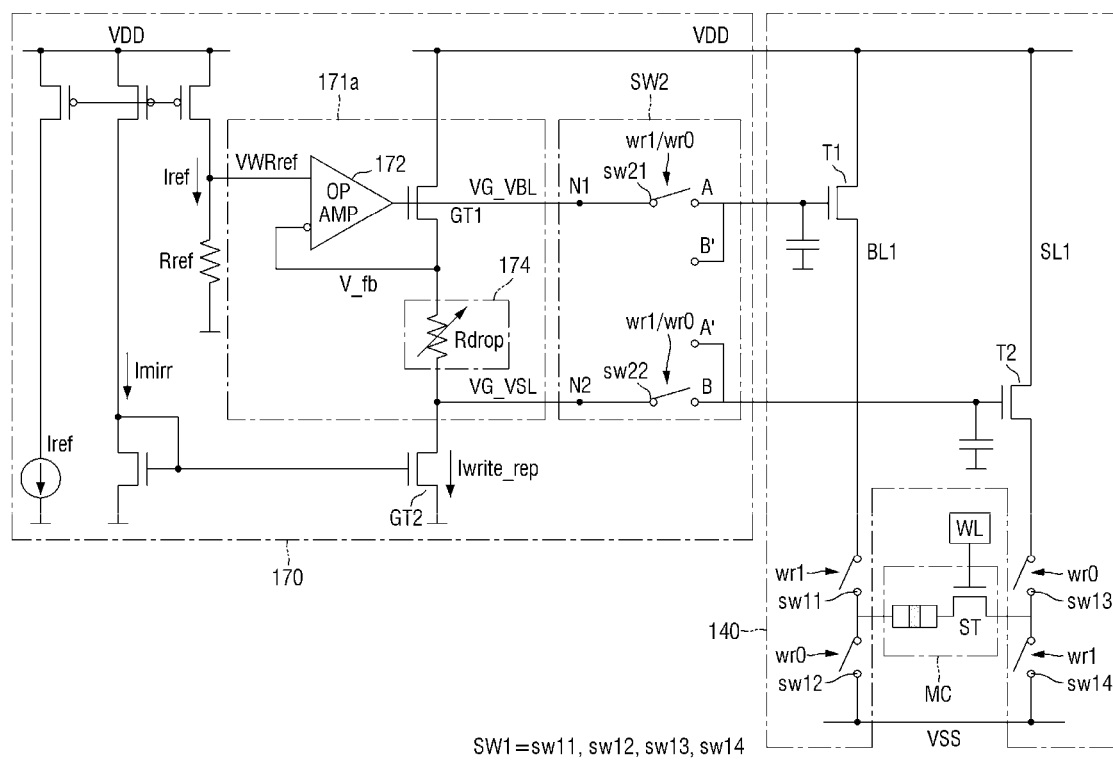
FIG. 5 illustrates the voltage generator, the write driver unit, and a memory cell of FIG. 2.

Referring to FIG. 5, the voltage generator 160 may generate the first and second gate voltages VG_VBL and VG_VSL during a write operation.

The first and second gate voltages VG_VBL and VG_VSL may be used for the write driver 140 to generate a write voltage.

Figure 14:
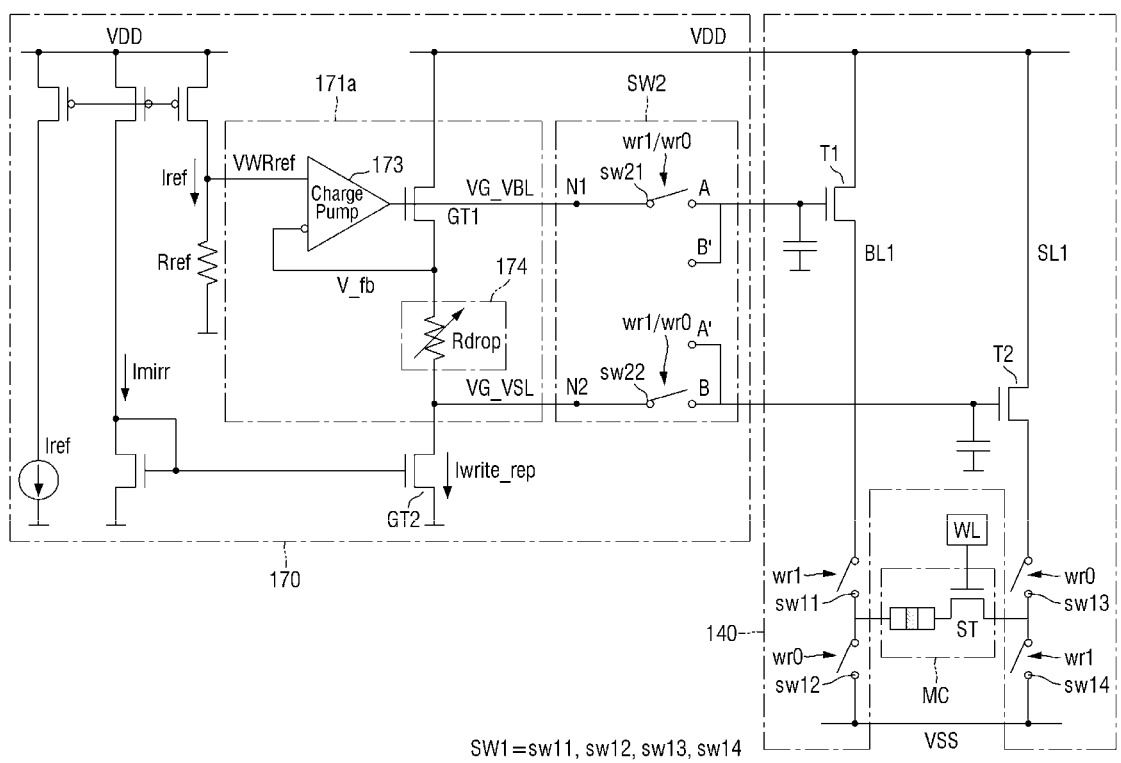
FIG. 14 illustrates a gate voltage generator having a charge pump, instead of an OP AMP.

Referring to FIG. 5 and again to FIG. 2, the voltage generator 170 may include one operational amplifier (OP AMP) 172 and/or one charge pump 173 (of FIG. 14).

That is, the OP AMP 172 or the charge pump 173, associated with the row decoder 120 or the column decoder 130, do not separately exist, but may be provided in the voltage generator 170.

Thus, the OP AMP 172 (of FIG. 5) or the charge pump 173 (of FIG. 14) may generate the first and second gate voltages VG_VBL and VG_VSL.

Accordingly, the area within the memory device 12, occupied by the OP AMP 172 or the charge pump 173, can be reduced. Also, the power consumption of the memory device 12 during a write standby can be reduced.

Figure 3:
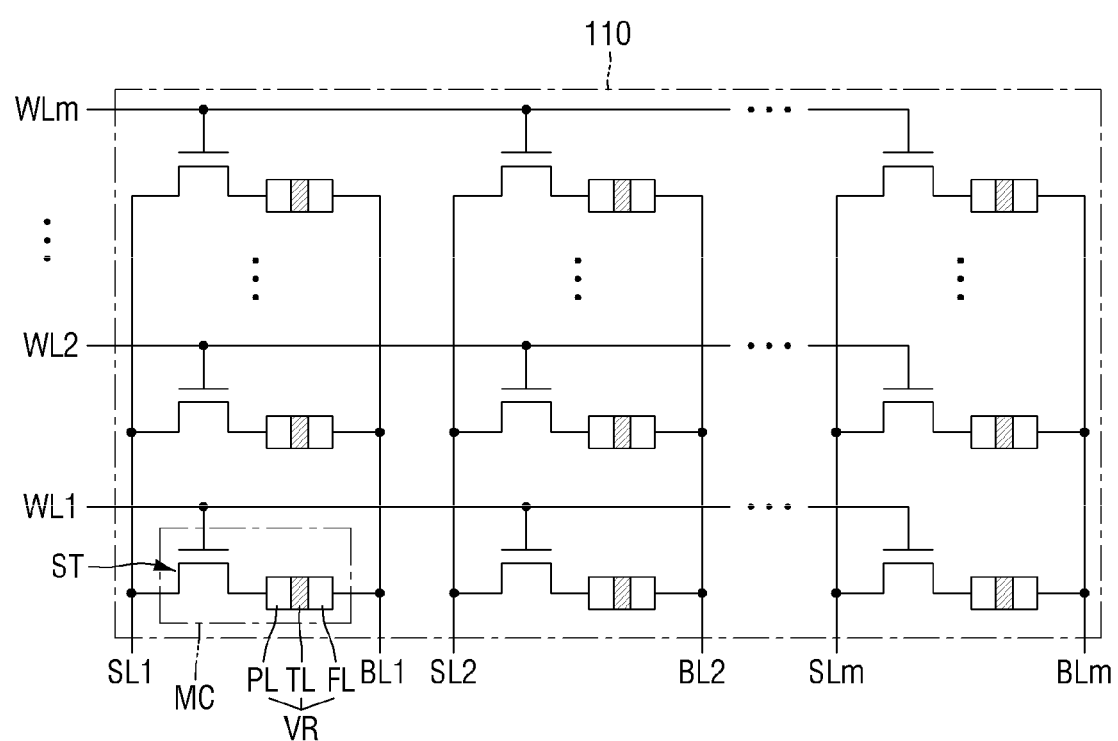
FIG. 3 illustrates a memory cell array of a resistive memory device according to some embodiments of the present disclosure.
Figure 4:
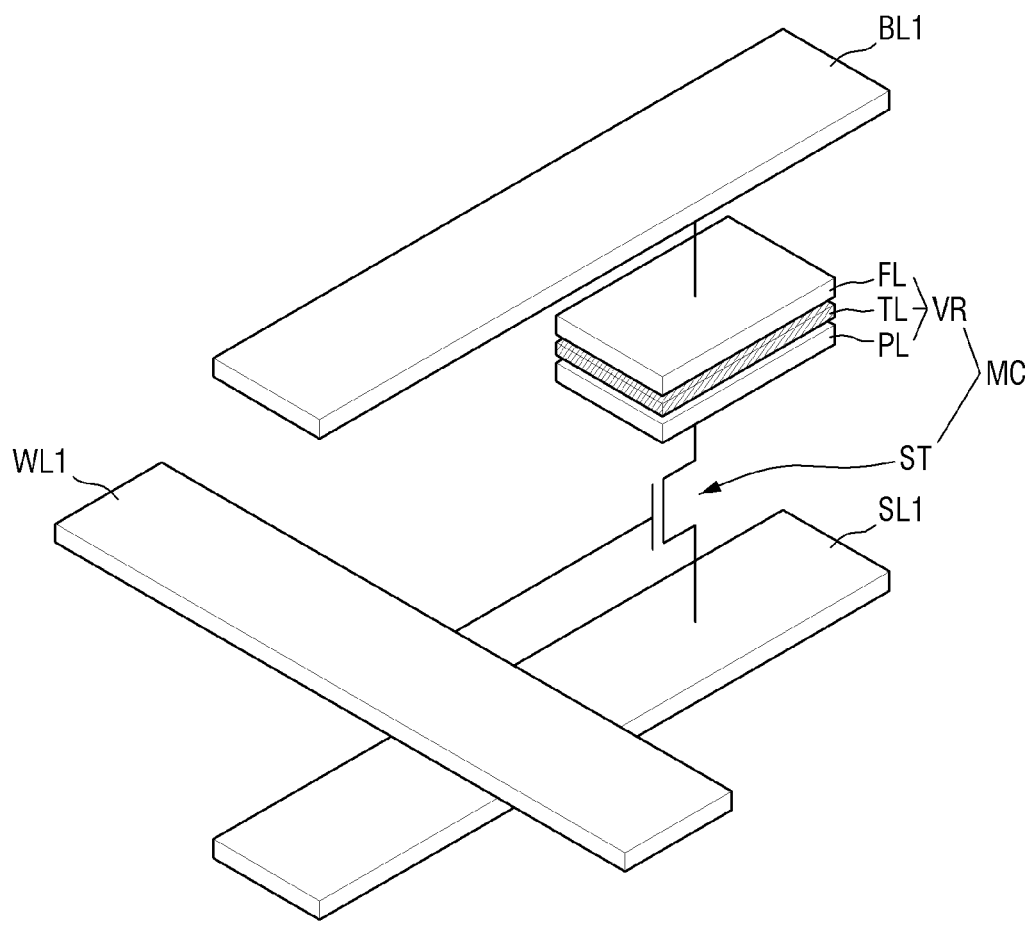
FIG. 4 illustrates a memory cell of a memory cell array according to some embodiments of the present disclosure.

FIG. 3 illustrates a memory cell array of a resistive memory device according to some embodiments of the present disclosure. FIG. 4 illustrates a memory cell of a memory cell array according to some embodiments of the present disclosure.

Referring to FIGS. 3 and 4, a memory cell array 110 includes memory cells MC.

One memory cell MC may include a selection transistor ST and a variable resistor VR.

The selection transistor ST may include a first junction connected to one of first through m-th source lines SL1 through SLm, a second junction connected to one of first through m-th bitlines BL1 through BLm via the variable resistor VR, and a gate connected to one of first through n-th wordlines WL1 through WLn, between the first and second junctions.

For example, the gate of the selection transistor ST may be connected to the first wordline WL1, one electrode of the selection transistor ST may be connected to the first bitline BL1 via the variable resistor VR, and the other electrode of the selection transistor ST may be connected to the first source line SL1.

The variable resistor VR includes a pinned layer PL, a tunneling layer TL, and a free layer FL. The pinned layer PL may have a magnetization direction. The free layer FL may have a magnetization direction that varies depending on the voltage (or current) applied to the variable resistor VR.

The resistance of the variable resistor VR may vary depending on whether and by what amount the magnetization direction of the free layer FL coincides with, or differs from, the magnetization direction of the pinned layer PL. The variable resistor VR may store data in the form of resistance magnitude.

As a write voltage is applied to the first through m-th bitlines BL1 through BLm and a low voltage (e.g., a ground voltage) is applied to the first through n-th source lines SL1 through SLn, a current may flow from the first through m-th bitlines BL1 through BLm to the first through m-th source lines SL1 through SLm. In this case, the magnetization direction of the free layer FL may become opposite to the magnetization direction of the pinned layer PL. The variable resistor VR of the memory cell MC may be switched to a high-resistance state.

As the write voltage is applied to the first through m-th source lines SL1 through SLm and a low voltage (e.g., the ground voltage) is applied to the first through m-th bitlines BL1 through BLm, a current may flow from the first through n-th source lines SL1 through SLm to the first through m-th bitlines BL1 through BLm. In this case, the magnetization direction of the free layer FL may become identical to the magnetization direction of the pinned layer PL. The variable resistor VR or the memory cell MC may be switched to a low-resistance state.

Figure 6:
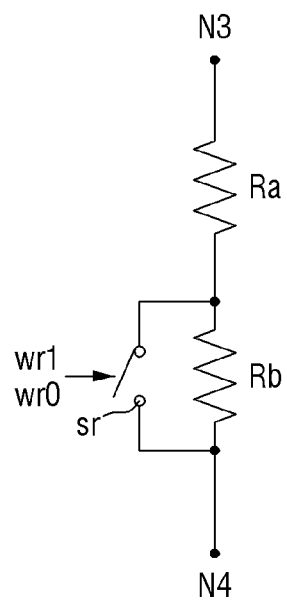
FIG. 6 illustrates the variable resistor of FIG. 5.
Figure 7:
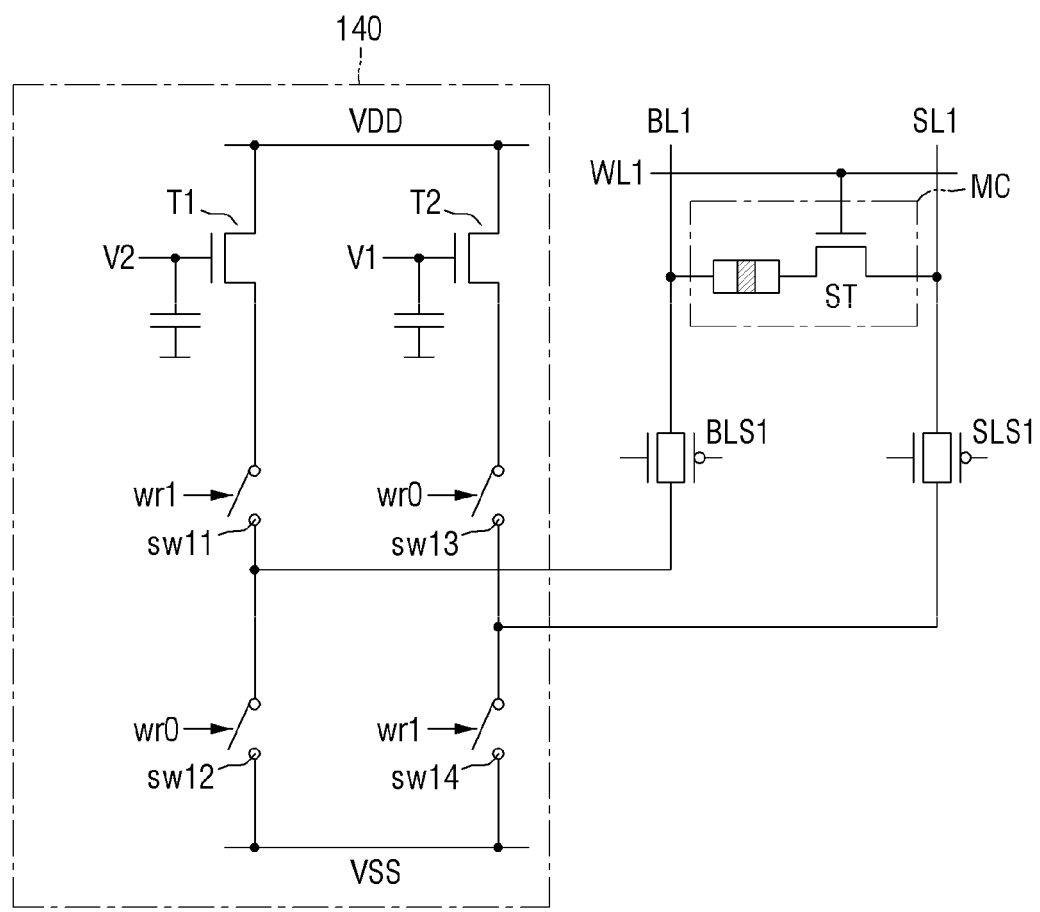
FIG. 7 illustrates the write driver unit and the memory cell of FIG. 5.

FIG. 5 illustrates the voltage generator, the write driver unit, and a memory cell of FIG. 2. FIG. 6 illustrates the variable resistor of FIG. 5. FIG. 7 illustrates the write driver unit and the memory cell of FIG. 5.

Referring to FIG. 5, the voltage generator 170 may include a gate voltage generator 171a and a second switch SW2. The voltage generator 170 may further include a second gate transistor GT2.

The gate voltage generator 171a may include the OP AMP 172, a first gate transistor GT1, and a variable resistor 174.

The gate voltage generator 171a may generate the first gate voltage VG_VBL, which is to be provided to a first transistor T1, and the second gate voltage VG_VSL, which is to be provided to a second transistor T2. The gate voltage generator 171a may include one OP AMP 172.

The OP AMP 172 may generate both the first and second voltages VG_VBL and VG_VSL. The OP AMP 172 may control the levels of the first and second voltages VG_VBL and VG_VSL.

For example, when an input signal VWRref is activated, the OP AMP 172 may raise the level of the first gate voltage VG_VBL via pumping. Pumping by OP AMP 172 raises the voltage to a stable voltage level that is held stable near a power rail, such as the second driving voltage VDD of FIG. 5. On the contrary, when the input signal VWRref is inactivated, the OP AMP 172 may stop pumping.

A first gate transistor GT1 may include a first terminal connected to a second driving voltage VDD, a second terminal connected to the variable resistor 174, and a gate terminal connected to the OP AMP 172. The first gate transistor GT1 may share the gate terminal with the first transistor T1.

The first gate transistor GT1 may operate by receiving a gate voltage generated by the OP AMP 172. Here, the gate voltage may be the first gate voltage VG_VBL.

The first gate transistor GT1 may be a N-type metal-oxide semiconductor (NMOS) transistor. The first gate transistor GT1 may operate as a source follower with respect to the first gate voltage VG_VBL.

Referring to FIG. 5, the variable resistor 174 may include a first terminal connected to the first gate transistor GT1 and a second terminal connected to the second gate transistor GT2.

Referring to FIG. 6, the variable resistor 174 may include a first resistor Ra, a switch sr, which is turned on or off by first and second write control signals wr0 and wr1, and a second resistor Rb, which is connected in parallel to the switch sr. The numbers of resistors and switches included in the variable resistor 174 are not particularly limited.

The resistance of the variable resistor 174 may become the resistance of the first resistor Ra in response to a first write control signal wr0. The resistance of the variable resistor 174 may become the sum of the resistances of the first and second resistors Ra and Rb in response to a second write control signal wr1. When the second write control signal wr1 is activated to open switch sr, first resistor Ra and second resistor Rb are in series between third node N3 and fourth node N4, such that the variable resistor 174 has a resistance Ra+Rb. The resistance of the first resistor Ra may be lower than the resistance of the second resistor Rb, in some embodiments.

Referring to FIGS. 5 and 6, a first terminal of the first resistor Ra may be connected to the first gate transistor GT1 at third node N3 of FIG. 6, and a second terminal of the first resistor Ra may be connected to the second resistor Rb.

A first terminal of the second resistor Rb may be connected to the first resistor Ra, and a second terminal of the second resistor Rb may be connected to the second gate transistor GT2.

The first gate voltage VG_VSL, which is generated by the OP AMP 172, may be provided to a third node N3, which is connected to the first resistor Ra. The second gate voltage VG_VSL, which is determined by the resistance of the variable resistor 174, may be provided to a fourth node N4, which is connected to the second resistor Rb.

Referring again to FIG. 5, the second gate transistor GT2 may include a first terminal, which is connected to the variable resistor 174 and the second switch SW2, and a second terminal, which is connected to a first driving voltage VSS.

A write reference current Iwrite_rep may flow in the second gate transistor GT2. The write reference current Iwrite_rep may be the same as a current that flows in the variable resistor 174. The voltage applied to the drain (e.g., the first terminal) of the second gate transistor GT2 may be the second gate voltage VG_VSL.

The second gate voltage VG_VSL may be calculated by Equation (1):

$$VG\_VSL = VG\_VBL - (Rdrop * Iwrite\_rep) \quad (1)$$

where VG_VBL denotes the first gate voltage, Rdrop denotes the resistance of the variable resistor 174, and Iwrite_rep denotes the current that flows in the variable resistor 174.

That is, the second gate voltage VG_VSL may be a voltage obtained by subtracting a voltage drop caused by the variable resistor 174 from the first gate voltage VG_VBL.

In other words, the second gate voltage VG_VSL may be a voltage dropped from the first gate voltage VG_VBL by the variable resistor 174. The second gate transistor GT2 may be an NMOS transistor.

The second switch SW2 may include first and second gate switches sw21 and sw22.

The second switch SW2 may divide the first and second gate voltages VG_VBL and VG_VSL, which are generated by the gate voltage generator 171a, between the gate electrodes of the first and second transistors T1 and T2.

The second switch SW2 may provide the first gate voltage VG_VBL to the first transistor T1 and the second gate voltage VG_VSL to the second transistor T2 in response to the first write control signal wr0.

A first gate switch sw21 of the second switch SW2 may connect a first node N1 and a node A in response to the first write control signal wr0, and a second gate switch sw22 of the second switch SW2 may connect a second node N2 and a node B in response to the first write control signal wr0.

On the contrary, the second switch SW2 may provide the first gate voltage VG_VBL to the second transistor T2 and the second gate voltage VG_VSL to the first transistor T1 in response to the second write control signal wr1.

The first gate switch sw21 of the second switch SW2 may connect the first node N1 and a node A' in response to the second write control signal wr1, and the second gate switch sw22 of the second switch SW2 may connect the second node N2 and a node B' in response to the second write control signal wr1.

Referring to FIGS. 5 and 7, the write driver 140 may include the first transistor T1, the second transistor T2, and a first switch SW1.

The write driver 140 may be connected to a memory cell MC via the first bitline BL1 and the first source line SL1.

The first transistor T1 may include a first terminal, to which a second driving voltage VDD is provided, a second terminal, to which a first driving voltage VSS is provided, and a gate terminal, to which the first gate voltage VG_VBL is provided.

The second transistor T2 may include a first terminal, to which the second driving voltage VDD is provided, a second terminal, to which the first driving voltage VSS is provided, and a gate terminal, to which the second gate voltage VG_VSL is provided.

The first switch SW1 may include a first write switch sw11, a second write switch sw12, a third write switch sw13, and a fourth write switch sw14.

The first write switch sw11 may be used to connect the first terminal of the first transistor T1 and a first terminal of the memory cell MC.

The second write switch sw12 may be used to provide the first driving voltage VSS to the first terminal of the memory cell MC.

The third write switch sw13 may be used to connect the first terminal of the second transistor T2 and a second terminal of the memory cell MC.

The fourth write switch sw14 may be used to provide the first driving voltage VSS to the second terminal of the memory cell MC.

The first and second write switches sw11 and sw12 may be connected to the first terminal of the first transistor T1, and the third and fourth write switches sw13 and sw14 may be connected to the first terminal of the second transistor T2.

In some embodiments, the first and fourth write switches sw11 and sw14 may form a current path from the first bitline BL1 to the first source line SL1 through the memory cell MC.

In some embodiments, the second and third write switches sw12 and sw13 may form a current path from the first source line SL1 to the first bitline BL1 through the memory cell MC.

In some embodiments, the first and fourth write switches sw11 and sw14 may be controlled by the second write control signal wr1.

In some embodiments, the second and third write switches sw12 and sw13 may be controlled by the first write control signal wr0.

Here, the first write control signal wr0 may be a signal applied to write a data value of 0 to the memory cell MC, and the second write control signal wr1 may be a signal applied to write a data value of 1 to the memory cell MC. When one of the first and second write control signals wr0 and wr1 is applied, the other write control signal may not be applied.

In some embodiments, the first switch SW1 may connect the second transistor T2 and the memory cell MC, but may not connect the first transistor T1 and the memory cell MC, in response to the first write control signal wr0.

In some embodiments, the first switch SW1 may connect the second transistor T2 and the memory cell MC, but may not connect the first transistor T1 and the memory cell MC, in response to the second write control signal wr1.

The memory cell MC may be connected to the first bitline BL1, the first source line SL1, the first switch SW1, and the first wordline WL1. The description of the memory cell MC may be directly applicable to other memory cells connected to other bitlines (e.g., the second through m-th bitlines BL2 through BLm) and other wordlines (e.g., the second through n-th wordlines WL2 through WLn).

The memory cell MC may include the first terminal, which is connected to the first and second write switches sw11 and sw12 via the first bitline BL1, and the second terminal, which is connected to the second and third write switches sw12 and sw13 via the first source line SL1.

The memory cell MC may store a data value of 0 or 1 in accordance with the first write control signal wr0 and/or the second write control signal wr1.

When the first wordline WL1 is activated, the selection transistor ST is activated so that the first bitline BL1 and the first source line SL1 may be connected via the memory cell MC.

In this case, a cell current CC (of FIG. 8) that flows in the memory cell MC may be generated. During a write operation, data may be written by the cell current CC. During a read operation, data may be read by sensing the cell current CC. However, the present disclosure is not limited to this.

The write driver 140 may write a data value of 0 or 1 to the memory cell MC in accordance with the second gate voltage VG_VSL, received from the voltage generator 170, and the first write control signal wr0 and/or the second write control signal wr1, received from the control logic 160. This will hereinafter be described in detail.

Figure 8:
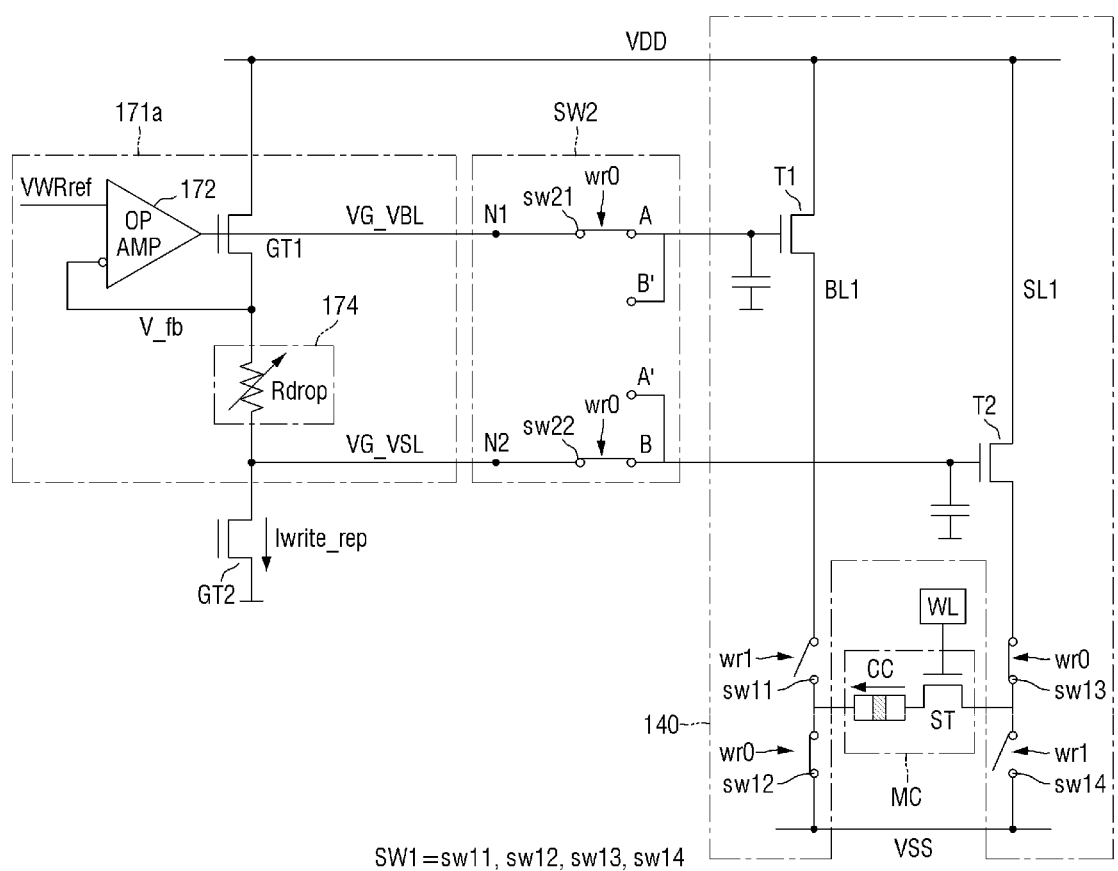
FIG. 8 illustrates a gate voltage generator, a write driver, and a memory cell when the first write control signal wr0 is activated.
Figure 9:
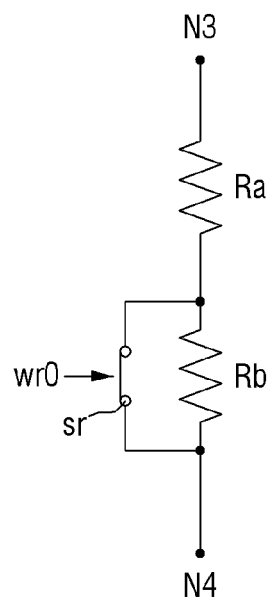
FIG. 9 illustrates a variable resistor of FIG. 8.
Figure 10:
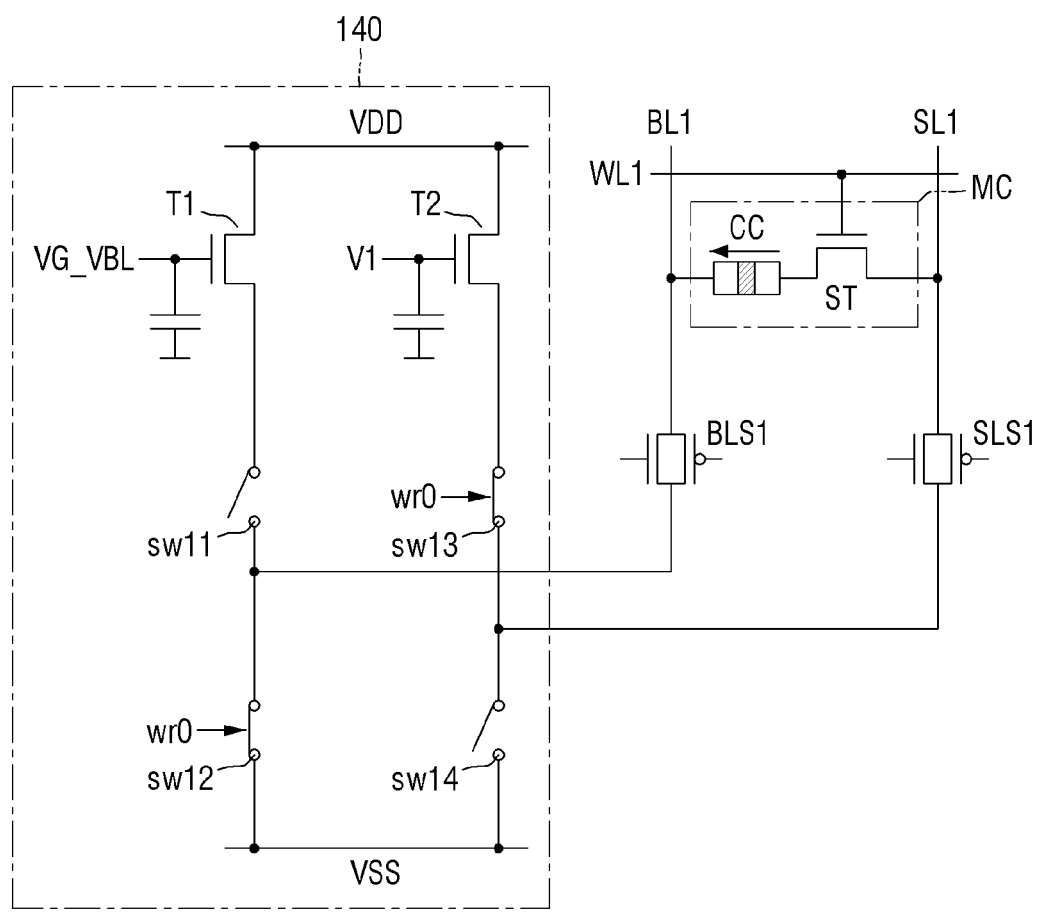
FIG. 10 illustrates the write driver and the memory cell of FIG. 8.

FIG. 8 illustrates a gate voltage generator, a write driver, and a memory cell when the first write control signal wr0 is activated. FIG. 9 illustrates a variable resistor of FIG. 8. FIG. 10 illustrates the write driver and the memory cell of FIG. 8.

FIGS. 8 through 10 are for explaining a write operation of writing first data to a memory cell.

An operation performed when the first write control signal wr0 is activated will hereinafter be described. When the first write control signal wr0 is activated, first data (e.g., a data value of 0) may be written to the memory cell MC.

When the first write control signal wr0 is activated, the second write control signal wr1, which is different from the first write control signal wr0, may be inactivated.

Referring to FIGS. 8 through 10, the first gate switch sw21 may connect the first node N1 and the node A in response to the first write control signal wr0, and the second gate switch sw22 may connect the second node N2 and the node B in response to the first write control signal wr0.

Accordingly, the second switch SW2 may provide the first gate voltage VG_VBL to the gate terminal of the first transistor T1 and the second gate voltage VG_VSL to the gate terminal of the second transistor T2.

The variable resistor 174 may generate a third gate voltage V1 by dropping the first gate voltage VG_VBL, which is generated by the OP AMP 172. The third gate voltage V1 may be provided to the gate terminal of the second transistor T2 in the form of the second gate voltage VG_VSL.

Referring to FIG. 9, as the first write control signal wr0 is applied, a switch sr of the variable resistor 174 is turned on. Accordingly, the resistance of the variable resistor 174 may become the resistance of the first resistor Ra since current bypasses second resistor Rb in this configuration.

The third gate voltage V1 may be calculated by Equation (2):

$$V1 = VG\_VBL - (Ra * Iwrite\_(\_rep)) \qquad (2)$$

where VG_VBL denotes the voltage generated by the OP AMP 172 of FIG. 8, Ra denotes the resistance of the first resistor Ra, and Iwrite_rep denotes the current that flows in the first resistor Ra of the variable resistor 174.

Referring to FIGS. 8 and 10, the third gate voltage V1 may be provided to the gate terminal of the second transistor T2, and the first gate voltage VG_VBL may be provided to the gate terminal of the first transistor T1.

The second and third write switches sw12 and sw13 are turned on in response to the first write signal wr0, and the first and fourth write switches sw11 and sw14 are turned off in response to the first write signal wr0. Accordingly, the second transistor T2 and the memory cell MC are connected, but the first transistor T1 and the memory cell MC are not connected.

As a result, the path of the cell current CC from the first source line SL1 to the first bitline BL1 through the memory cell MC may be formed. Due to the cell current CC, a data value of 0 may be written to the memory cell MC.

Figure 11:
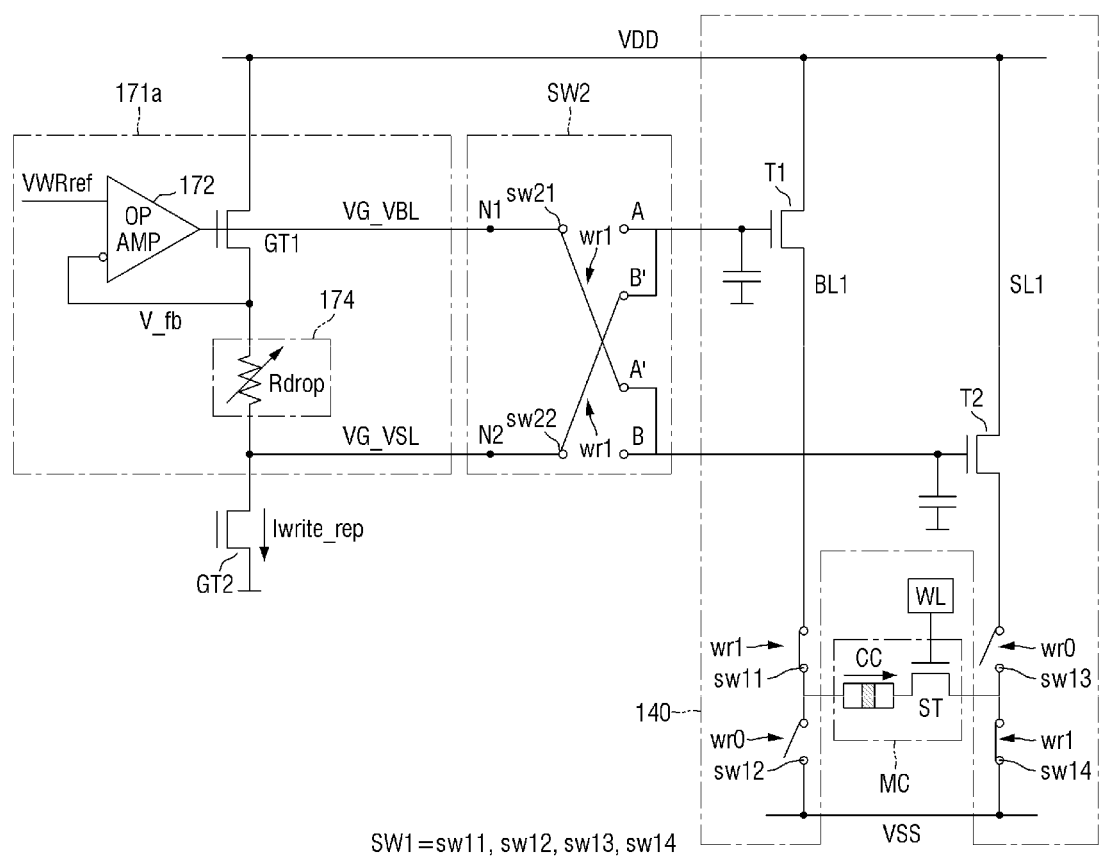
FIG. 11 illustrates a gate voltage generator, a write driver, and a memory cell when the second write control signal wr1 is activated.
Figure 12:
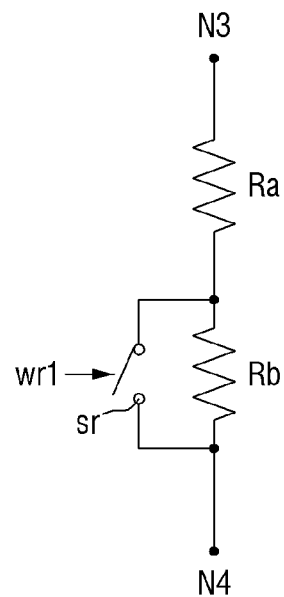
FIG. 12 illustrates a variable resistor of FIG. 11.
Figure 13:
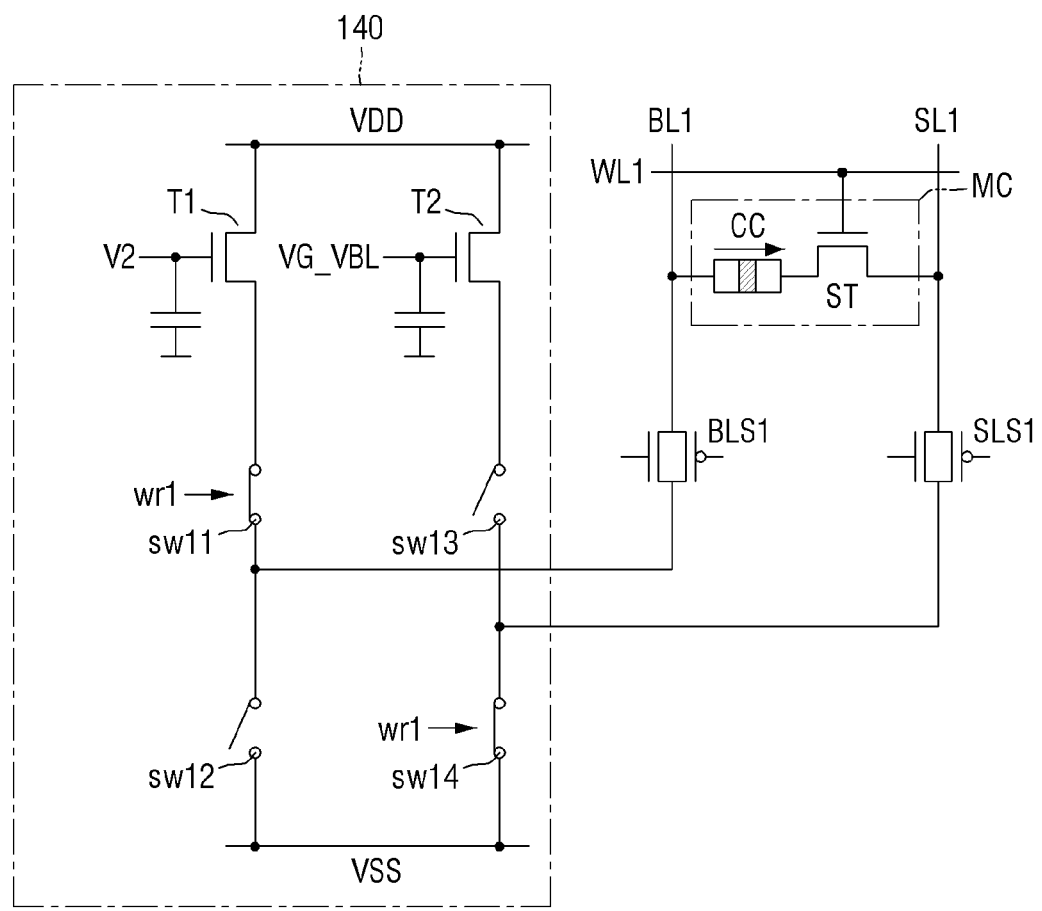
FIG. 13 illustrates the write driver and the memory cell of FIG. 11.

FIG. 11 illustrates a gate voltage generator, a write driver, and a memory cell when the second write control signal wr1 is activated. FIG. 12 illustrates a variable resistor of FIG. 11. FIG. 13 illustrates the write driver and the memory cell of FIG. 11.

FIGS. 11 through 13 are for explaining a write operation of writing second data to a memory cell. The write operation of FIGS. 11 through 13 will hereinafter be described, focusing mainly on the differences with the write operation of FIGS. 8 through 10.

An operation performed when the second write control signal wr1 is activated will hereinafter be described. When the second write control signal wr1 is activated, second data (e.g., a data value of 1) may be written to the memory cell MC.

When the second write control signal wr1 is activated, the first write control signal wr0, which is different from the second write control signal wr1, may be inactivated.

Referring to FIGS. 11 through 13, the first gate switch sw21 may connect the first node N1 and the node A' in response to the second write control signal wr1, and the second gate switch sw22 may connect the second node N2 and the node B' in response to the second write control signal wr1.

Accordingly, the second switch SW2 may provide the first gate voltage VG_VBL to the gate terminal of the second transistor T2 and the second gate voltage VG_VSL may be provided to the gate terminal of the first transistor T1.

The variable resistor 174 may generate a fourth gate voltage V2 by dropping the first gate voltage VG_VBL, which is generated by the OP AMP 172. The fourth gate voltage V2 may be provided to the gate terminal of the first transistor T1 in the form of the second gate voltage VG_VSL.

Referring to FIG. 12, as the second write control signal wr1 is applied, the switch sr of the variable resistor 174 is turned off such that the current bypasses switch sr and flows through the second resistor Rb. Accordingly, the resistance of the variable resistor 174 may become the sum of the resistances of the first and second resistors Ra and Rb between third node N3 and fourth node N4.

The fourth gate voltage V2 may be calculated by Equation (3):

$$V2=VG\_VBL-((Ra+Rb)*Iwrite\_(\_rep)) \quad (3)$$

where VG_VBL denotes the voltage generated by the OP AMP 172 of FIG. 11, Ra+Rb denotes the sum of the resistances of the first and second resistors Ra and Rb, and Iwrite_rep denotes the current that flows in the first and second resistors Ra and Rb of the variable resistor 174.

Referring to FIGS. 11 and 13, the fourth gate voltage V2 may be provided to the gate terminal of the first transistor T1, and the first gate voltage VG_VBL may be provided to the gate terminal of the second transistor T2.

The first and fourth write switches sw11 and sw14 are turned on in response to the second write signal wr1, and the second and third write switches sw12 and sw13 are turned off in response to the second write signal wr1. Accordingly, the first transistor T1 and the memory cell MC are connected, but the second transistor T2 and the memory cell MC are not connected.

As a result, the path of the cell current CC from the first bitline BL1 to the first source line SL1 through the memory cell MC may be formed. Due to the cell current CC, a data value of 1 may be written to the memory cell MC.

FIG. 14 illustrates a gate voltage generator having a charge pump, instead of an OP AMP. The gate voltage generator of FIG. 14 will hereinafter be described, focusing mainly on the differences with the gate voltage generator of FIG. 5.

Referring to FIG. 14, a gate voltage generator 171b may include a charge pump 173, instead of an OP AMP 172.

The charge pump 173 may generate both first and second gate voltages VG_VBL and VG_VSL. The charge pump 173 may control the levels of the first and second gate voltages VG_VBL and VG_VSL.

Those skilled in the art will appreciate that many variations and modifications can be made to the example embodiments without substantially departing from the principles of the present inventive concept. Therefore, the disclosed embodiments of the inventive concept are used in a generic and descriptive sense and not for purposes of limitation.

What is claimed is:

1. A resistive memory device comprising:
a bitline;
a source line;
a memory cell electrically connected to the bitline and the source line by a first switch;
a first transistor electrically connected to the bitline;
a second transistor electrically connected to the source line;
a gate voltage generator configured to generate a first gate voltage for a gate electrode of the first transistor, and configured to generate a second gate voltage for a gate electrode of the second transistor, wherein the first gate voltage is different from the second gate voltage; and
a second switch configured to provide the first and second gate voltages to the respective gate electrodes of the first and second transistors,
wherein the gate voltage generator comprises an operational amplifier that is configured to generate both the first and second gate voltages or a charge pump that is configured to generate both the first and second gate voltages.

2. The resistive memory device of claim 1,
wherein the first switch is configured to electrically connect the second transistor and the memory cell, but not electrically connect the first transistor and the memory cell, in response to a first write control signal, and
wherein the first switch is configured to electrically connect the first transistor and the memory cell, but not electrically connect the second transistor and the memory cell, in response to a second write control signal, that is different from the first write control signal.

3. The resistive memory device of claim 2,
wherein the first switch comprises first, second, third, and fourth write switches,
wherein the first write switch is configured to electrically connect a first end of the first transistor and a first end of the memory cell,
wherein the second write switch is configured to provide a first driving voltage to the first end of the memory cell,
wherein the third write switch is configured to electrically connect a first end of the second transistor and a second end of the memory cell, and
wherein the fourth write switch is configured to provide the first driving voltage to the second end of the memory cell.

4. The resistive memory device of claim 2,
wherein the first switch comprises first, second, third, and fourth write switches,
wherein the first and fourth write switches are configured to form a current path from the bitline to the source line through the memory cell, and
wherein the second and third write switches are configured to form a current path from the source line to the bitline through the memory cell.

5. The resistive memory device of claim 1,
wherein the second switch comprises first and second gate switches,
wherein the second switch is configured to provide the first gate voltage to the first transistor and the second gate voltage to the second transistor in response to a first write control signal, and is configured to provide the second gate voltage to the first transistor and the first gate voltage to the second transistor in response to a second write control signal, that is different from the first write control signal.

6. The resistive memory device of claim 1, wherein the gate voltage generator comprises:
a first gate transistor comprising a gate terminal configured to receive the first gate voltage; and
a variable resistor that is electrically connected to a first terminal of the first gate transistor.

7. The resistive memory device of claim 6, wherein a first resistance of the variable resistor responsive to a first write control signal differs from a second resistance of the variable resistor responsive to a second write control signal that is different from the first write control signal.

8. The resistive memory device of claim 7, wherein the first resistance is lower than the second resistance.

9. The resistive memory device of claim 6,
wherein a first resistance of the variable resistor responsive to a first write control signal is lower than a second resistance of the variable resistor responsive to a second write control signal that is different from the first write control signal, and
wherein the first switch is configured to electrically connect the second transistor and the memory cell, but not electrically connect the first transistor and the memory cell, in response to the first write control signal, and
wherein the first switch is configured to electrically connect the first transistor and the memory cell, but not electrically connect the second transistor and the memory cell, in response to the second write control signal.

10. A resistive memory device comprising:
a bitline;
a source line;
a memory cell electrically connected to the bitline and the source line by a first switch;
a first transistor electrically connected to the bitline;
a second transistor electrically connected to the source line;
a second switch electrically connected to gate terminals of the first and second transistors; and
a gate voltage generator comprising a variable resistor and configured to generate first and second gate voltages based on a resistance of the variable resistor,
wherein the second gate voltage is lower than the first gate voltage, and
wherein the second switch is configured to provide the first gate voltage to the gate terminal of the second transistor in response to a first write control signal and configured to provide the second gate voltage to the gate terminal of the first transistor in response to a second write control signal, that is different from the first write control signal.

11. The resistive memory device of claim 10, wherein the first switch is configured to form a current path from the source line to the bitline through the memory cell in response to the first write control signal and configured to form a current path from the bitline to the source line through the memory cell in response to the second write control signal.

12. The resistive memory device of claim 10, wherein the resistance of the variable resistor is a first resistance in response to the first write control signal and is a second resistance, that is higher than the first resistance in response to the second write control signal.

13. The resistive memory device of claim 10,
wherein the variable resistor comprises a pinned layer, a tunneling layer, and a free layer, and
wherein the resistance of the variable resistor depends on a magnetization direction of the free layer and a magnetization direction of the pinned layer.

14. A resistive memory device comprising:
a write driver; and
a gate voltage generator that is configured to generate a gate voltage,
wherein the write driver comprises a bitline, a source line, a first switch that is electrically connected to the bitline and the source line, a first transistor that is electrically connected to the bitline, and a second transistor that is electrically connected to the source line, and
wherein the gate voltage generator comprises a first gate transistor that shares a gate terminal of the first transistor, and a variable resistor that is electrically connected to a gate terminal of the second transistor and a first terminal of the first gate transistor.

15. The resistive memory device of claim 14,
wherein the first switch comprises first, second, third, and fourth write switches,
wherein the first and second write switches are electrically connected to a first terminal of the first transistor, and
wherein the third and fourth write switches are electrically connected to a first terminal of the second transistor.

16. The resistive memory device of claim 15, further comprising:
a memory cell comprising a first terminal electrically connected to the first and second write switches via the bitline and comprising a second terminal electrically connected to the third and fourth write switches by the source line.

17. The resistive memory device of claim 14,
wherein the gate voltage generator comprises at least one of an operational amplifier or a charge pump, and
wherein the gate terminal of the first gate transistor is electrically connected to the at least one of the operational amplifier or the charge pump.

18. The resistive memory device of claim 14, further comprising:
a selection transistor comprising a first electrode and a second electrode; and
a second gate transistor,
wherein a second terminal of the variable resistor is electrically connected to the second gate transistor,
wherein a gate of the selection transistor is electrically connected to a wordline,
wherein the first electrode of the selection transistor is electrically connected to the bitline via the variable resistor, and
wherein the second electrode of the selection transistor is electrically connected to the source line.

* * * * *